(12) United States Patent
Hatano

(10) Patent No.: US 9,780,267 B2
(45) Date of Patent: Oct. 3, 2017

(54) DISPLAY DEVICE

(71) Applicant: NICHIA CORPORATION, Anan-shi, Tokushima (JP)

(72) Inventor: Tomohiko Hatano, Naruto-shi (JP)

(73) Assignee: NICHIA CORPORATION, Ana-shi, Tokushima (JP)

( * ) Notice: Subject to any disclaimer, the term of this patent is extended or adjusted under 35 U.S.C. 154(b) by 69 days.

(21) Appl. No.: 14/835,946

(22) Filed: Aug. 26, 2015

(65) Prior Publication Data

US 2016/0064615 A1 Mar. 3, 2016

(30) Foreign Application Priority Data

Aug. 29, 2014 (JP) ................................. 2014-175988

(51) Int. Cl.
| | | |
|---|---|---|
| H01L 33/44 | (2010.01) | |
| H01L 33/52 | (2010.01) | |
| H01L 25/075 | (2006.01) | |
| H01L 33/62 | (2010.01) | |

(52) U.S. Cl.
CPC .......... *H01L 33/52* (2013.01); *H01L 25/0753* (2013.01); *H01L 33/62* (2013.01); *H01L 2924/0002* (2013.01)

(58) Field of Classification Search
CPC .......... F21Y 2101/02; F21K 9/00; G09F 9/30; G09F 9/33; H01L 25/167; H01L 33/52; H01L 25/0753; H01L 33/62; H01L 27/156; H01L 33/44; H01L 33/486
See application file for complete search history.

(56) References Cited

U.S. PATENT DOCUMENTS

| | | | |
|---|---|---|---|
| 6,364,507 B1 * | 4/2002 | Yang ....................... | F21V 31/00 362/240 |
| 7,559,673 B2 * | 7/2009 | Meersman ................ | G09F 9/30 362/245 |
| 2007/0165162 A1 * | 7/2007 | Meersman ................ | G09F 9/30 349/114 |

(Continued)

FOREIGN PATENT DOCUMENTS

| | | |
|---|---|---|
| JP | 11-133891 A | 5/1999 |
| JP | 2898600 B | 6/1999 |

(Continued)

*Primary Examiner* — Latanya N Crawford
(74) *Attorney, Agent, or Firm* — Squire Patton Boggs (US) LLP

(57) ABSTRACT

A display device includes a substrate, and a plurality of surface-mounted LEDs which are provided in a matrix pattern on a front surface side of the substrate. A plurality of eave members are provided between rows of the plurality of surface-mounted LEDs on the front surface side of the substrate. A plurality of connecting members are provided between columns of the plurality of surface-mounted LEDs on the front surface side of the substrate. A waterproof resin is provided in a space surrounded by the plurality of eave members and the plurality of connecting members so as to expose front surfaces of the plurality of surface-mounted LEDs and front surfaces of the plurality of connecting members. The plurality of connecting members are formed with a wide width on a front surface side and formed with a narrow width on a rear surface side.

18 Claims, 4 Drawing Sheets

(56) References Cited

U.S. PATENT DOCUMENTS

2011/0096045 A1\* 4/2011 Ito .............................. G09F 9/33
345/204

FOREIGN PATENT DOCUMENTS

| JP | 2002-358033 | A | 12/2002 |
| JP | 2002-368290 | A | 12/2002 |
| JP | 2003-084680 | A | 3/2003 |
| JP | 3875768 | B | 1/2007 |
| JP | 5470895 | B | 4/2014 |

\* cited by examiner

DISPLAY DEVICE

CROSS-REFERENCE TO RELATED APPLICATION

The present application claims priority to Japanese Patent Application No. 2014-175988, filed on Aug. 29, 2014, which is incorporated by reference in its entirety.

BACKGROUND

Field

The present disclosure relates to a display device.

Description of the Related Art

A display device including a substrate and light-emitting diodes arranged and fixed in a lattice pattern on the substrate is proposed, in which the light-emitting diodes are sealed by a waterproof resin or the like in order to secure waterproof property between the light-emitting diodes and the substrate. Refer to paragraph 0017 in Japanese Patent Application Laid-open No. 2003-84680.

However, with the conventional display device described above, when the waterproof resin is exposed on a front surface side of the display device, glare of the waterproof resin may become prominent on the front surface side of the display device and may cause visibility of the display device to decline.

SUMMARY

A display device includes a substrate, and a plurality of surface-mounted LEDs which are provided in a matrix pattern on a front surface side of the substrate. A plurality of eave members are provided between respective rows of the plurality of surface-mounted LEDs on the front surface side of the substrate. A plurality of connecting members are provided between respective columns of the plurality of surface-mounted LEDs on the front surface side of the substrate and connect the plurality of eave members. A waterproof resin is provided in spaces surrounded by the plurality of eave members and the plurality of connecting members so as to expose front surfaces of the plurality of surface-mounted LEDs and front surfaces of the plurality of connecting members respectively. The plurality of connecting members are formed with a wide width on a front surface side and formed with a narrow width on a rear surface side.

According to the display device described above, since exposure of the waterproof resin on the front surface side of the display device is suppressed, a display device with superior visibility in which glare of the waterproof resin is less prominent can be provided.

DETAILED DESCRIPTION

Figure 1:
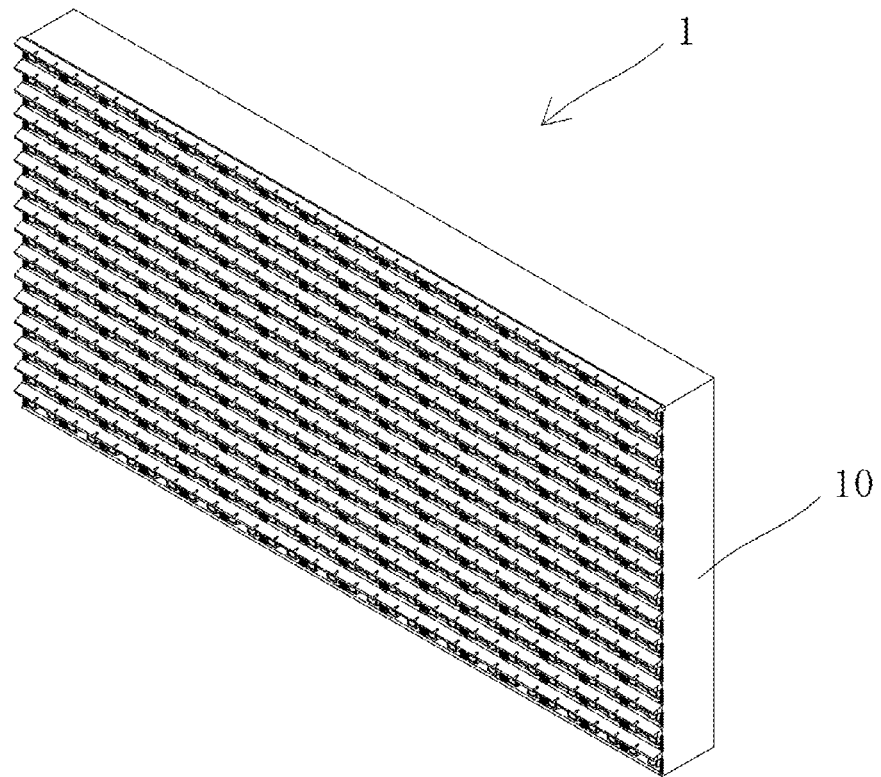
FIG. 1 is a schematic perspective view of a display device according to a first embodiment.
Figure 2:
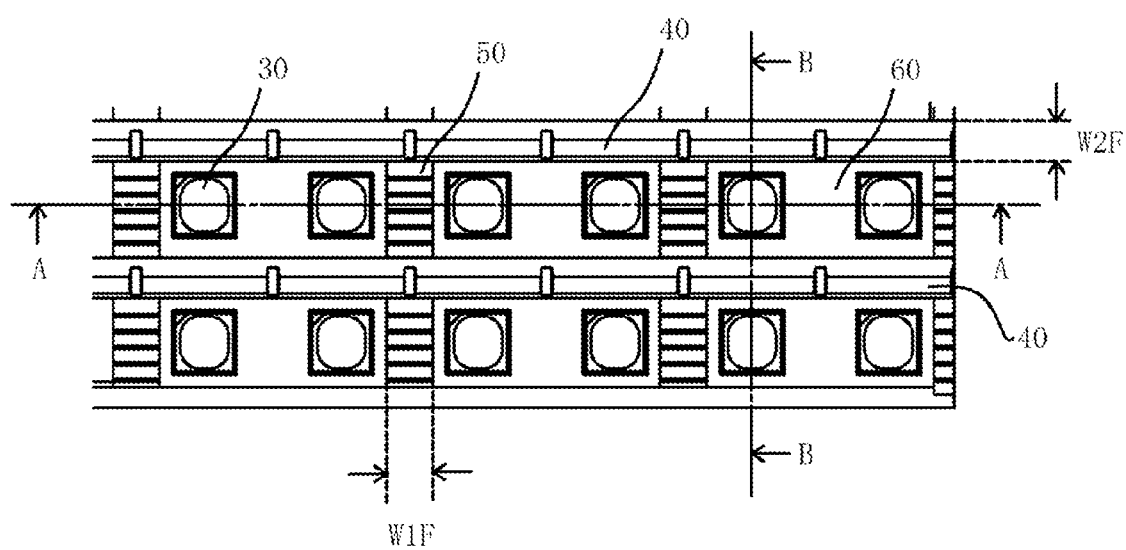
FIG. 2 is a schematic plan view of a display device according to the first embodiment.
Figure 3:
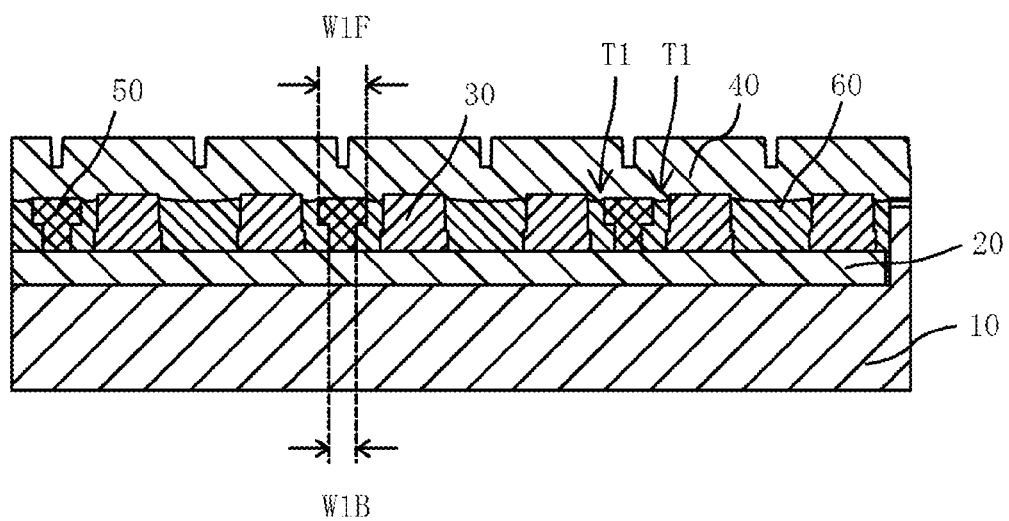
FIG. 3 is a schematic view showing a cross section taken along A-A in FIG. 2.
Figure 4:
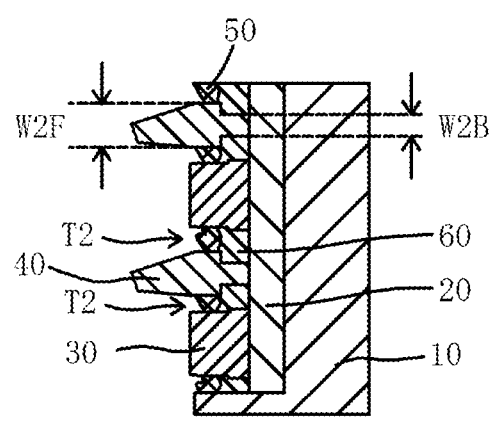
FIG. 4 is a schematic view showing a cross section taken along B-B in FIG. 2.

FIG. 1 is a schematic perspective view of a display device according to a first embodiment, and FIG. 2 is a schematic plan view of a display device according to the first embodiment. In addition, FIG. 3 is a schematic view showing a cross section taken along A-A in FIG. 2; and FIG. 4 is a schematic view showing a cross section taken along B-B in FIG. 2. Hereinafter, a display device according to the first embodiment will be described with reference to FIGS. 1 to 4.

As shown in FIGS. 1 to 4, a display device 1 according to a first embodiment is a display device including a substrate 20, and a plurality of surface-mounted LEDs 30 which are provided in a matrix pattern on a front surface side of the substrate 20. A plurality of eave members 40 are provided between respective rows of the plurality of surface-mounted LEDs 30 on the front surface side of the substrate 20. A plurality of connecting members 50 are provided between respective columns of the plurality of surface-mounted LEDs 30 on the front surface side of the substrate 20 and connect the plurality of eave members 40. A waterproof resin 60 provided in a space surrounded by the plurality of eave members 40 and the plurality of connecting members 50 so as to expose front surfaces of the plurality of surface-mounted LEDs 30 and front surfaces of the plurality of connecting members 50. The plurality of connecting members 50 are formed with a first, wide width on a front surface side and formed with a second, narrow width on a rear surface side. With the display device 1 according to the first embodiment, a width W1F of the connecting members 50 on a front surface side is wider than a width W1B of the connecting members 50 on a rear surface side. Therefore, since exposure of the waterproof resin 60 on the front surface side of the display device 1 is suppressed, the display device 1 with superior visibility in which glare of the waterproof resin 60 is less prominent can be provided. A detailed description will be given below.

As the substrate 20, for example, a so-called rigid substrate such as a glass epoxy substrate or a glass composite substrate can be used. Dimensions of the substrate 20 may be, for example, from 100 to 300 mm vertically, from 100 to 300 mm horizontally, and from 1.5 to 2.5 mm in thickness. Wirings for mounting the surface-mounted LEDs 30 are provided on the substrate 20.

The substrate 20 is fixed to a case 10 by, for example, screwing, adhesion, or heat welding. As the case 10, for example, a member fabricated using polycarbonate resin or ABS resin can be used. A shape of the case 10 can be, for example, rectangular.

The plurality of surface-mounted LEDs 30 are provided in a matrix pattern on a front surface of the substrate 20. LED is an abbreviation for Light Emitting Diode.

The front surfaces of the plurality of surface-mounted LEDs 30 are preferably positioned forward of the front surfaces of the plurality of connecting members 50. Accordingly, it becomes possible to prevent light from the surface-mounted LEDs 30 from blocking by the connecting members 50, and wide light distribution characteristics can be maintained.

The number of surface-mounted LEDs 30 provided between the connecting members 50 is not limited. This number may be 1 or 2 or more. In the case where one surface-mounted LED 30 is provided, a region in which the front surfaces of the connecting members 50 are exposed can be relatively easily increased on the front surface side of the display device 1.

Accordingly, exposure of the waterproof resin 60 can be further reduced and thus visibility of the display device 1 can be further improved. On the other hand, in the case where two or more surface-mounted LEDs 30 are provided, a wide space for inserting a resin filling nozzle can be secured between the surface-mounted LEDs 30. Accordingly, the waterproof resin 60 can be spread on side surfaces of each surface-mounted LED 30 to sufficiently cover entire side surfaces of the surface-mounted LEDs 30 with the waterproof resin 60. As a result, waterproof performance of the display device 1 can be further improved.

The plurality of eave members 40 are members for blocking external light which advances toward the display device 1 (for example, sunlight or illuminating light) and improving visibility of the display device 1. The eave members 40 are provided between respective rows of the plurality of surface-mounted LEDs 30 on the front surface side of the substrate 20. Dimensions, a shape or the like of the eave members 40 are not particularly limited. As the plurality of eave members 40, for example, members which are made of resin material such as polycarbonate resin or ABS resin and formed by using injection-molding method can be used.

The plurality of connecting members 50 are members for connecting the plurality of eave members 40 and are provided between respective columns of the plurality of surface-mounted LEDs 30 on the front surface side of the substrate 20. As the plurality of connecting members 50, for example, members which are made of resin material such as polycarbonate resin or ABS resin and formed by using injection-molding method can be used. For example, the plurality of connecting members 50 may be made of the material same as the plurality of eave members 40 to be formed by molding integrally.

The plurality of connecting members 50 are structured to have a first width, which is a wide width, on a front surface side and to have a second width, which is a narrow width, on a rear surface side. Structuring the connecting members 50 to have wide width on the front surface side allows increasing a region in which the connecting members 50 are exposed and reducing exposure of the waterproof resin 60 on the front surface side of the display device 1, so that the display device 1 with superior visibility in which glare of the waterproof resin 60, which is a phenomenon that the waterproof resin 60 reflect external light and the waterproof resin 60 looks like shining, is less prominent can be provided. Each of the plurality of eave members 40 has a portion which is embedded in the waterproof resin 60, and the portion preferably also has a wide width (third width) on a front surface side and has a narrow width (fourth width) on a rear surface side in a similar manner to the plurality of connecting members 50. Such a structure allows for further reducing exposure of the waterproof resin 60 on the front surface side of the display device 1, so that the display device 1 with superior visibility in which glare of the waterproof resin 60 is less prominent can be provided.

Rear surfaces of the plurality of connecting members 50 and rear surfaces of the plurality of eave members 40 are preferably in contact with the substrate 20. Accordingly, even in the case where the connecting members 50 and the eave members 40 are relatively thin, deformation of the connecting members 50 and the eave members 40 can be suppressed by being supported by the substrate 20, and unevenness in light distribution characteristics due to such deformation of the connecting members 50 and the eave members 40 can be suppressed. In addition, since individual spaces partitioned by the substrate 20, the connecting members 50, and the eave members 40 can be separately filled with the waterproof resin 60, the waterproof resin 60 can be provided on the substrate 20 with no gaps, so that waterproof performance of the display device 1 can be further improved. Furthermore, due to a capillary phenomenon, the waterproof resin 60 filled into the individual spaces described above creep up narrow gaps T1 and T2 that are between side surfaces of the surface-mounted LEDs 30, side surfaces of the connecting members 50, and side surfaces of the eave members 40. Accordingly, the entire side surfaces of the surface-mounted LEDs 30 can be more easily covered by the waterproof resin 60. A maximum distance between the side surfaces of the surface-mounted LEDs 30 and the side surfaces of the connecting members 50 or between the side surfaces of the surface-mounted LEDs 30 and the side surfaces of the eave members 40 preferably ranges, for example, from 0.5 to 1 mm. Such structure allows a capillary phenomenon to be utilized in a suitable manner. Viscosity of the waterproof resin 60 is preferably, for example, from 1 to 2 Pa·s. Such viscosity allows for facilitating occurrences of a capillary phenomenon, so that the entire side surfaces of the surface-mounted LEDs 30 can be more easily covered by the waterproof resin 60.

A cross-sectional shape of the plurality of connecting members 50 is preferably formed in, for example, a shape in which a width gradually decreases from the front surface side toward the rear surface side or a T shape such as that shown in FIG. 3. Forming the plurality of connecting members 50 in a T shape allows for suppressing separation of the waterproof resin 60 from the display device 1, and thus the display device 1 with superior reliability can be provided. A width W1F of one of the plurality of connecting members 50 on the front surface side can be set to, for example, 2 to 15 mm in a row direction. In addition, a width W1B of one of the plurality of connecting members 50 on the rear surface side can be set to, for example, 1.5 to 10 mm in a row direction.

The front surfaces of the plurality of connecting members 50 are preferably rough surfaces and, more specifically, include an irregular shape. Such a structure allows for diffusing external light efficiently on the front surfaces of the connecting members 50 and suppressing glare of the front surfaces of the connecting members 50, so that visibility of the display device 1 can be further improved.

The waterproof resin 60 is a member for improving waterproof property of the display device 1. The waterproof resin 60 is provided in a space that is surrounded by the plurality of eave members 40 and the plurality of connecting members 50 so that the front surfaces of the plurality of surface-mounted LEDs 30 and the front surface of the plurality of connecting members 50 are exposed. Such a structure allows further reducing exposure of the waterproof resin 60 on the front surface side of the display device 1 compared to the case where the front surfaces of the plurality of surface-mounted LEDs 30 and the front surfaces of the plurality of connecting members 50 are completely covered with the waterproof resin 60.

As the waterproof resin 60, any resin material capable of improving waterproof performance of the display device 1, and a material such as silicon resin, epoxy resin, or urethane resin can be used. In the first embodiment, silicon resin is to be used. The waterproof resin 60 is filled by, for example, inserting the resin filling nozzle between the surface-mounted LEDs 30, between the surface-mounted LEDs 30 and the eave members 40, or between the connecting members 50.

As described above, with the display device 1 according to the first embodiment, the width W1F of one of the connecting members 50 on a front surface side is wider than the width W1B of one of the connecting members 50 on a rear surface side. Accordingly, exposure of the waterproof resin 60 on the front surface side of the display device 1 can be reduced, the display device 1 with superior visibility in which glare of the waterproof resin 60 is less prominent can be provided.

Moreover, in the display device 1 according to the first embodiment, the width W1F of the connecting members 50 on the front surface side is wider than the width W1B of the connecting members 50 on a rear surface side, in other words, the width W1B of the connecting members 50 on the rear surface side is narrower than the width W1F of the connecting members 50 on the front surface side. Such a structure allows reducing exposure of the waterproof resin 60 on the front surface side of the display device 1 and making glare of the waterproof resin 60 less prominent. And, additionally, the entire side surfaces of the surface-mounted LEDs 30 can be sufficiently covered with the waterproof resin 60 on the rear surface side of the display device 1. In other words, in a display device using the surface-mounted LEDs 30, the spaces T1 between the plurality of connecting members 50 on the rear surface side is more likely to be narrower than in a display device using lamp type LEDs (refer to reasons 1 and 2 described later). Accordingly, it is difficult to spread the waterproof resin 60 into the gap T1 so as to sufficiently cover the entire side surfaces of the surface-mounted LEDs 30 with the waterproof resin 60. However, according to the present embodiment, the width W1B of the connecting members 50 on the rear surface side is narrower than the width W1F of the connecting members 50 on the front surface side. Such a structure allows for securing sufficient gaps T1 into which the waterproof resin 60 can readily spread on the rear surface side of the connecting members 50. Furthermore, since a width W2B of the eave member 40 on a rear surface side is narrower than a width W2F of the eave members 40 on the front surface side. Such a structure allows for securing sufficient gaps T2 into which the waterproof resin 60 can readily spread on the rear surface side of the eave members 40. Therefore, according to the present embodiment, the display device 1 with superior waterproof property in which the entire side surfaces of the surface-mounted LEDs 30 are sufficiently covered with the waterproof resin 60 on the rear surface side of the display device 1 can be provided.

Since bottom surfaces of the surface-mounted LEDs 30 are directly mounted on a surface of the mounting substrate 20, unlike a lamp type LED that is mounted on the mounting substrate 20 via two or three terminals, the gaps T1 in a vicinity of the surface of the mounting substrate 20 (the gaps T1 of the plurality of connecting members 50 on the rear surface side) are more likely to be narrower.

Since the surface-mounted LEDs 30 are smaller than lamp type LEDs, in a case where the surface-mounted LEDs 30 are used, downsizing of the entire display device 1 can be achieved by reducing a distance between centers of two adjacent surface-mounted LEDs 30 (in other words, by reducing an interval (pitch) at which the LEDs are mounted). However, reducing the distance between centers of two adjacent surface-mounted LEDs 30 allows reducing a distance on the rear surface side of the connecting members 50 between the surface-mounted LEDs 30 and the eave members 40 or a distance between the surface-mounted LEDs 30 and the connecting members 50. Therefore, even in this respect, the gaps T1 of the plurality of connecting members 50 on the rear surface side are more likely to be narrower in a display device that uses the surface-mounted LEDs 30.

As described above, according to the present embodiment, in the display device 1 using the surface-mounted LEDs 30, gaps T1 which are sufficiently large to readily spread the waterproof resin 60 therein can be secured on the rear surface side of the connecting members 50, so that substantially the entire side surfaces of the surface-mounted LEDs 30 can be sufficiently covered by the waterproof resin 60.

For example, according to the present embodiment, even in the case of using surface-mounted LEDs 30 whose dimensions are, for example, from 1.5 to 4 mm vertically, from 1.5 to 4 mm horizontally, and from 1 to 3 mm in thickness, the entire side surfaces of the surface-mounted LEDs 30 can be sufficiently covered with the waterproof resin 60. Furthermore, according to the present embodiment, in addition to the case where the distance between centers of two adjacent surface-mounted LEDs 30 is from 3 to 20 mm, the entire side surfaces of the surface-mounted LEDs 30 can be sufficiently covered by the waterproof resin 60 even in cases where, for example, the distance between centers of two adjacent surface-mounted LEDs 30 is from 3 to 10 mm or from 4 to 8 mm.

In the foregoing, while the description has been given of the embodiment and Examples, the description has been given by way of illustration and is not intended to limit the configuration stated in the scope of claims.

The invention claimed is:

1. A display device comprising:
   a substrate;
   a plurality of surface-mounted LEDs which are disposed in a matrix pattern on a front surface side of the substrate;
   a plurality of eave members which are disposed between respective rows of the plurality of surface-mounted LEDs on the front surface side of the substrate;
   a plurality of connecting members which are disposed between respective columns of the plurality of surface-mounted LEDs on the front surface side of the substrate and which connect the plurality of eave members; and
   a waterproof resin provided in spaces surrounded by the plurality of eave members and the plurality of connecting members so as to expose front surfaces of the plurality of surface-mounted LEDs and front surfaces of the plurality of connecting members respectively, wherein
   the plurality of connecting members are formed with a first width on a front surface side and formed with a second width, narrower than the first width, on a rear surface side, and
   the waterproof resin is in contact with at least one of the plurality of surface-mounted LEDs.

2. The display device according to claim 1, wherein each of the plurality of eave members has a portion which is embedded in the waterproof resin, and the portion is formed with a third width on a front surface side and formed with a fourth width, narrower than the third width, on a rear surface side.

3. The display device according to claim 1, wherein the front surfaces of the plurality of surface-mounted LEDs are positioned forward of the front surfaces of the plurality of connecting members.

4. The display device according to claim 2, wherein the front surfaces of the plurality of surface-mounted LEDs are positioned forward of the front surfaces of the plurality of connecting members.

5. The display device according to claim 1, wherein rear surfaces of the plurality of connecting members and rear surfaces of the plurality of eave members are in contact with the substrate.

6. The display device according to claim 2, wherein rear surfaces of the plurality of connecting members and rear surfaces of the plurality of eave members are in contact with the substrate.

7. The display device according to claim 1, wherein a maximum distance between the side surfaces of the surface-mounted LEDs and the side surfaces of the connecting members ranges from 0.5 to 1 mm.

8. The display device according to claim 2, wherein a maximum distance between the side surfaces of the surface-mounted LEDs and the side surfaces of the connecting members ranges from 0.5 to 1 mm.

9. The display device according to claim 1, wherein a maximum distance between the side surfaces of the surface-mounted LEDs and the side surfaces of the eave members ranges from 0.5 to 1 mm.

10. The display device according to claim 2, wherein a maximum distance between the side surfaces of the surface-mounted LEDs and the side surfaces of the eave members ranges from 0.5 to 1 mm.

11. The display device according to claim 1, wherein a cross-sectional shape of the plurality of connecting members is formed in a T shape.

12. The display device according to claim 2, wherein a cross-sectional shape of the plurality of connecting members is formed in a T shape.

13. The display device according to claim 1, wherein the first width of the plurality of connecting members on the front surface side is set to 2 to 15 mm in a row direction.

14. The display device according to claim 2, wherein the first width of the plurality of connecting members on the front surface side is set to 2 to 15 mm in a row direction.

15. The display device according to claim 1, wherein the second width of the plurality of connecting members on the rear surface side is set to 1.5 to 10 mm in a row direction.

16. The display device according to claim 2, wherein the second width of the plurality of connecting members on the rear surface side is set to 1.5 to 10 mm in a row direction.

17. The display device according to claim 1, wherein the front surfaces of the plurality of connecting members are rough surfaces.

18. The display device according to claim 2, wherein the front surfaces of the plurality of connecting members are rough surfaces.

* * * * *